United States Patent
Gajic et al.

(10) Patent No.: US 7,812,615 B2
(45) Date of Patent: Oct. 12, 2010

(54) METHOD AND DEVICE FOR FAULT DETECTION IN TRANSFORMERS OR POWER LINES

(75) Inventors: Zoran Gajic, Västerås (SE); Ivo Brncic, Västerås (SE)

(73) Assignee: ABB AB, Västerås (SE)

( * ) Notice: Subject to any disclaimer, the term of this patent is extended or adjusted under 35 U.S.C. 154(b) by 680 days.

(21) Appl. No.: 10/585,123

(22) PCT Filed: Dec. 22, 2004

(86) PCT No.: PCT/SE2004/001997

§ 371 (c)(1),
(2), (4) Date: Oct. 1, 2007

(87) PCT Pub. No.: WO2005/064759

PCT Pub. Date: Jul. 14, 2005

(65) Prior Publication Data

US 2008/0130179 A1    Jun. 5, 2008

(30) Foreign Application Priority Data

Dec. 31, 2003    (SE) .................................... 0303615

(51) Int. Cl.
G01R 31/06    (2006.01)
G01R 31/08    (2006.01)
H02H 7/04    (2006.01)
H02H 3/26    (2006.01)

(52) U.S. Cl. ...................... 324/547; 324/521; 324/522; 361/36; 361/76

(58) Field of Classification Search ......... 324/520–524, 324/547; 361/35, 36, 76
See application file for complete search history.

(56) References Cited

U.S. PATENT DOCUMENTS 4,398,232 A * 8/1983 Elmore ...................... 324/521

(Continued)

FOREIGN PATENT DOCUMENTS

WO    WO-02/33426 A1    4/2002

OTHER PUBLICATIONS

Shengli Huang et al.; Analysis of balanced and unbalanced faults in power systems using dynamic phasors; Power System Technology; Oct. 2002; pp. 1550-1557.

(Continued)

Primary Examiner—Timothy J Dole
(74) Attorney, Agent, or Firm—Venable LLP; Eric J. Franklin

(57) ABSTRACT

A method for fault detection in a power transformer/autotransformer and/or interconnected power lines, which are within the zone protected by the differential protection, and particularly suitable for detecting turn-to-turn faults in power transformer/autotransformer windings. All individual instantaneous phase currents of the protected object are measured, individual phase currents as fundamental frequency phasors are calculated, the contributions of the individual protected object sides negative sequence currents to the total negative sequence differential current are calculated by compensating for the phase shift of an eventual power transformer within the protected zone, the relative positions of the compensated individual sides negative sequence currents in the complex plane are compared, in order to determine whether the source of the negative sequence currents, i.e. the fault position, is within the protected zone or outside of the protected zone, delimited with current transformer locations, the protected object is disconnected if determined that the source of the negative sequence currents is within the protected zone.

10 Claims, 4 Drawing Sheets

U.S. PATENT DOCUMENTS

| | | | |
|---|---|---|---|
| 5,455,776 A | * | 10/1995 | Novosel ................. 324/521 |
| 5,514,978 A | | 5/1996 | Koegl et al. |
| 5,784,233 A | | 7/1998 | Bastard et al. |
| 6,148,267 A | * | 11/2000 | Premerlani ................. 324/521 |
| 6,483,680 B1 | | 11/2002 | Kulidjian et al. |
| 6,507,184 B1 | | 1/2003 | Elston |
| 6,518,767 B1 | | 2/2003 | Roberts et al. |

OTHER PUBLICATIONS

Gajic et al; Verification of utility requirements on modern numerical transformer protection by dynamic simulation; Developments in Power System Protection, Apr. 2001; pp. 209-212.

PCT/ISA/210—International Search Report—Apr. 18, 2005.

PCT/IPEA/409—International Preliminary Report on Patentability—Dec. 20, 2005.

* cited by examiner

+ : positive direction of a current

METHOD AND DEVICE FOR FAULT DETECTION IN TRANSFORMERS OR POWER LINES

CROSS-REFERENCE TO RELATED APPLICATIONS

This application claims priority to Swedish patent application 0303615-9 filed 31 Dec. 2003 and is the national phase under 35 U.S.C. §371 of PCT/SE2004/001997.

TECHNICAL FIELD OF THE INVENTION

This invention relates to a method and a device for improved protection of power transformers, autotransformers or power lines from the effects of internal faults by using an advanced differential protection system.

BACKGROUND OF THE INVENTION

Faults in power transformers may lead to widespread consequences, both in the form of power failure for a large group of customers and in the form of that the faulty transformer has to be exchanged or at least repaired. Both consequences are troublesome and costly for the supplier of the electrical power. The consequences of unwanted disconnections of healthy equipment, such as power transformers, is also very costly. In the worst case, the unwanted disconnections can result in wider black-outs.

Protection devices such as differential relays normally safeguard power transformers. Differential relays typically have a minimum operating current level set to 30% of the protected power transformer current rating. The set value should be that high in order to prevent unwanted operation of the differential relay due to the On Load Tap Changer (OLTC) that typically is used in modern power transformers. When OLTC moves from one position to another, amplitude mismatch between power transformer winding currents will outcome causing a false differential current. Normally, the range of an OLTC might be around 15% of rated voltage so the contribution of around 15% to differential current may occur.

The set value should also be high enough in order to prevent unwanted operation of the differential relay due to Protection CT (current transformer) errors, or unequalities.

Known transformer differential relays are usually not sensitive enough for low-level internal faults, which may happen for example within a power transformer tank. Power transformer winding turn-to-turn faults belong to such type of internal faults. In the same time, according to available fault statistic, turn-to-turn faults are one of the most common internal faults inside a power transformer.

Traditional power transformer differential relays utilize individual phase currents from different windings of the transformer in order to form the phase-vise differential currents. In modern numerical differential relays these differential currents are usually formed by using mathematical equations, which are dependent on the vector group of the power transformer.

The most common weaknesses of a traditional power transformer differential protection are long operation delays in case of heavy internal faults followed by main CT saturation due to $2^{nd}$ harmonic blocking feature, and unwanted operations for external faults. They also have bad sensitivity for low level internal faults, i.e. winding turn-to-turn faults, which are thus allowed to develop into more severe faults, involving the power transformer iron core.

Long delays for heavy internal faults, they can be in the order of several tens of milliseconds, are a consequence of the harmonic distortion of the fault currents as they are seen by the differential relay. The harmonic distortion is due to initial heavy saturation of the current transformers under fault condition. Harmonic restrain criterion prevents immediate operation of the differential protection.

Further, power transformer differential protections show a tendency to unwanted operations for faults external to the protected zone with the power transformer, particularly for external earth faults.

Within this area of technology several inventions try to deal with these kinds of problems and some patents have been granted.

As an example U.S. Pat. No. 5,514,978 is a patent that includes measuring of negative sequence impedance by using voltage measurements! The document describe an invention that determines the existence of a turn fault that comprises estimating a current differential by dividing the negative sequence voltage phasor by a characteristic negative sequence impedance and subtracting the result from the negative sequence current phasor, and comparing the estimated current differential with a threshold current differential.

In the present invention measurements of the voltage is not used at all. The present invention is instead based on comparison of negative sequence currents from the different sides of the protected power transformer.

The U.S. Pat. No. 6,507,184 concerns a method and apparatus for differential current measurement in a three-phase power system. This invention is arranged to measure the differential current between a first and a second terminal and to obtain, for each phase, a measure of these currents. This patent does not involve a negative sequence differential protection at all.

The invention according to the U.S. Pat. No. 6,518,767 concerns protection of power transmission lines and includes tripping of the circuit breaker. Similar circuitry is also used for negative sequence current quantities, with the negative sequence preselected values being set substantially lower to produce a more sensitive response to possible faults in the line.

The present invention concerns mainly the technical area of power transformer protection, but can as well be extended as power line protection or a combination of them, while the above patent concerns protection of a power transmission line only. The power transformer according to the present invention introduces phase shift and voltage level difference between power transformer sides. Therefore the negative sequence currents from different power transformer sides have to be first related to each other. After that the negative sequence current differential principle or method is used and a direction comparison is made to protect power transformers against internal short-circuit and ground faults. Above this the present invention as well protect the power transformer against turn-to-turn faults, which are series faults and not a shunt fault as in the patent application U.S. Pat. No. 6,518,767. This turn-to-turn fault protection capability is an important advantage of the present invention. This turn-to-turn fault is the most common, but in the same time the most difficult, fault to detect within a power transformer/autotransformer.

The invention according to U.S. Pat. No. 6,483,680 compares the phase angle difference between fundamental frequency (i.e. 50 Hz or 60 Hz) and second harmonic component (i.e. 100 Hz or 120 Hz) of the power transformer differential currents. More precisely, the invention compare complex ratio between these two phasors. This is done in order to determine if transformer is faulty during energizing (i.e.

switch-on) of power transformer. This principle does not detect any internal or external fault during normal operating condition (i.e. through-load condition) of the power transformer, because it can only operate during power transformer energizing from one side. A typically power transformer is switched on just a couple of times per year (i.e. often just once for the yearly inspection). This means that the power transformer is energized and connected on at least two side for most of its life time (typically more than 95%). Therefore U.S. Pat. No. 6,483,680 has very limited use during this short time of power transformer energizing. Additionally this method typically can not detect small faults like turn-to-turn faults even during power transformer energizing.

The patent application WO02/33426 concerns a line differential protection system for a power transmission line. All three phase current values are obtained from both the local end and the remote end of a power transmission line. Comparison elements are arranged to compare the ratio and angel values against preselected values, which establish a restrain region in the current ratio plane. Current values, which result in a ratio outside of the region, result in a tripping of the circuit breaker. Similar circuitry is used for negative sequence current quantities, with the negative sequence preselected values being set substantially lower to produce a more sensitive response to possible faults in the line.

This invention also concerns a differential protection system for a power transmission line. The system is not usable for a power transformer protection system.

SUMMARY OF THE INVENTION

The object of the present invention is to solve above indicated problems and present a method and a device for efficient detection of a fault in a power transformer.

Another object of the present invention is to detect if the fault is internal or external.

A further object of the present invention is to detect if the fault is symmetrical or unsymmetrical.

Still another object of the present invention is to present a method and a device that is able to detect turn-to-turn faults very fast and with high sensitivity.

These and other objects are achieved according to the present invention by a method and a device and a computer program product.

The invention mainly compares the phase angle difference between negative sequence current component from different sides of power transformer. Negative sequence current quantities only exist during abnormal operating condition in the power system and they are of the fundamental frequency nature (i.e. 50 Hz or 60 Hz). These negative sequence components from different sides have to be first put on the same base by matrix manipulations explained in the patent application. This is done in order to detect internal fault, including low-level winding turn-to-turn faults during loaded condition of the power transformer. We use the same method as well to detect external fault condition (i.e. external/internal fault discriminator). However our principle can not detect internal fault during power transformer energizing from one side. In order for our principle to work power transformer must be loaded and connected at least from two sides.

The real breakthrough in this method is the capability to detect low level internal faults like winding turn-to-turn faults, before then develop into the more serious earth faults, which are very much more time consuming and expensive to repair.

BRIEF DESCRIPTION OF DRAWINGS

For better understanding of the present invention, reference will be made to the below drawings/figures.

DETAILED DESCRIPTION OF PREFERRED EMBODIMENTS

Figure 1:
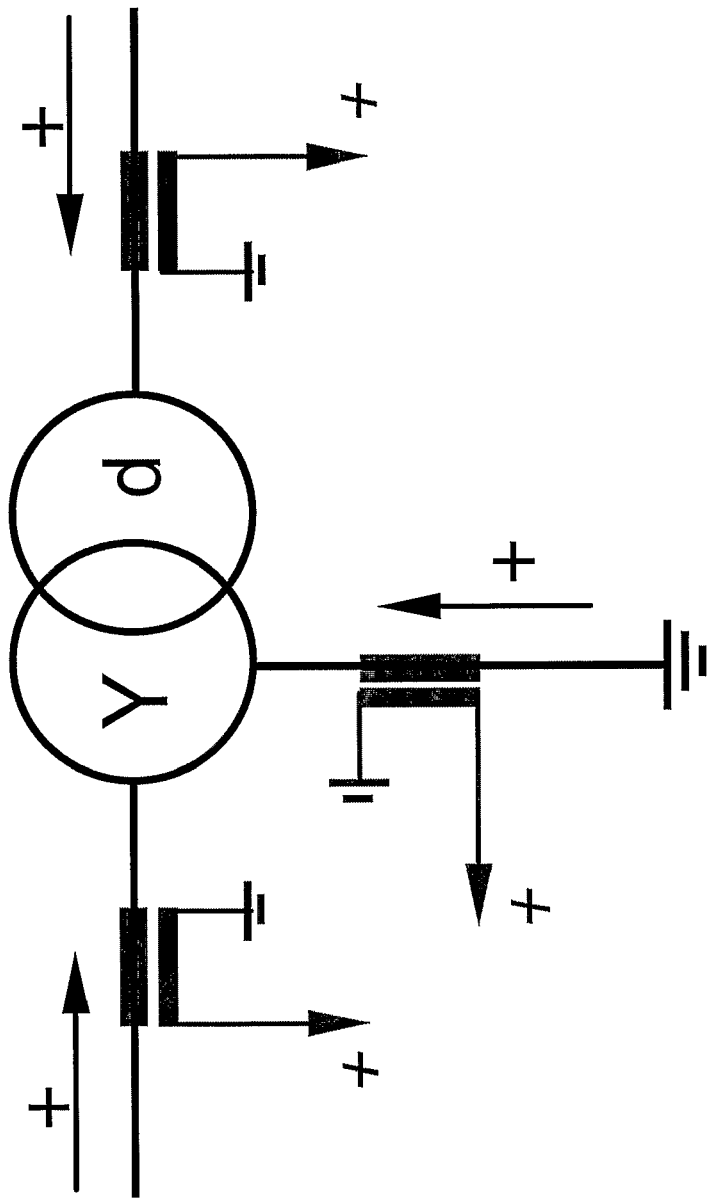
FIG. 1 illustrates the connection of current transformers, defining the positive direction of currents.

In FIG. 1 is illustrated an internal/external fault discriminator for protection of power transformers. The fault discriminator is made on pairs of components of the total negative sequence differential current. This discriminator may be implemented as a complement to the normal power transformer differential protection.

The internal/external fault discriminator determines the position of the source of the negative sequence fault currents with respect to the protected zone. If the source of the negative sequence fault currents is found to be outside the protection zone, then the fault is external.

If the source is found to be inside the zone, the fault is internal. The position of the negative sequence current source is determined as follows. At an internal fault, a degree of negative sequence differential current appears, and its two components (for a two-winding power transformer) are of the same direction, i.e. out of the protection zone.

At an external fault, the total negative sequence differential current remains zero or is very small, until CT saturation sets in, while its two components are equal in magnitude, until CT saturation sets in, and of the opposite direction, i.e. one in, and the other out of the protection zone.

The internal/external fault discriminator can only be active when the protected power transformer is energized and loaded as well.

Both detection of faults, and a secure discrimination between internal and external faults can be achieved based on an analysis of the negative sequence differential current, or better, based on an analysis of its two (or three at three-winding transformers) separate components, or separate parts. With a reliable fault discrimination algorithm, the power transformer differential protection
  operates very fast for heavy internal faults,
  is stable against external faults,
  operates for minor internal faults, as inter-turn.

Existence of a relatively high negative sequence current is in itself a proof of a disturbance on the power system, possibly a fault. The source of negative sequence current is at fault. Thus, if the source of the negative sequence current is found to be outside the protected zone, which includes the power transformer, then the fault must be external, and nothing shall be done in a short term. On the other hand, if the source of the negative sequence current is found to be inside the protection zone, then the fault is internal, that is, a fault on the protected power transformer can be suspected, and the transformer shall be disconnected from the power system immediately. The information on whether the fault is internal or external is obtained within about one half of the fundamental power system cycle after the fault has occurred.

The principle of negative-sequence-current-based directional criterion gives a fast and reliable discrimination between external and internal faults. This is quite logical in the case of unsymmetrical faults, where the negative sequence currents are expected to exist. But the principle is just as efficient at wholly symmetrical three-phase faults. The reason is that when a symmetrical fault occurs, the negative sequence system exists for a while, i.e. until the dc components in the fault currents vanish. This interval of time is long enough for the directional criterion to positively distinguish between an internal and an external fault.

In the following the principle of the discriminator is described. In order to define what is meant by the "same direction", and by the "opposite direction", an explanation of this is as follows.

For an external fault, with the negative sequence source at the point of fault, it is clear that the negative sequence currents enter the healthy power transformer on one side, and leave it on the other side, properly transformed. According to FIG. 1, the negative sequence currents on the respective power transformer sides have opposite directions, or better, the differential protection sees these currents with a relative phase shift of 180 degrees.

For an internal fault (with the negative sequence source at the point of fault) it is clear that the negative sequence currents leave the faulty power transformer on both sides. According to FIG. 1, the currents on the respective power transformer sides have the same direction, the differential protection sees these currents with a relative phase shift of 0 degrees. In reality, there may be some phase shift between these currents due to different negative sequence impedance angles of the circuits on the respective power transformer sides, while the magnitudes of the negative sequence currents depend on the magnitudes of the negative sequence impedances of circuits on the respective sides.

The same coefficient matrices can be used for the calculation of the negative sequence differential currents as they are used for the calculation of the "common" power transformer/autotransformer differential current. The only difference is that the individual winding negative sequence currents must be fed into the equation instead of the individual winding phase currents. The coefficient matrices allow for power transformer ratio and vector group connection. Because the negative sequence differential currents are symmetrical, only one differential current needs to be calculated, for example the negative sequence differential current in phase L1, i.e. Idns_L1. The negative sequence differential current must be calculated on a regular base and be available at any time.

$$\begin{bmatrix} Idns\_L1 \\ Idns\_L2 \\ Idns\_L3 \end{bmatrix} = \begin{bmatrix} a_{11} a_{12} a_{13} \\ a_{21} a_{22} a_{23} \\ a_{31} a_{32} a_{33} \end{bmatrix} * \begin{bmatrix} Ins\ A \\ Ins\ B \\ Ins\ C \end{bmatrix} + \begin{bmatrix} b_{11} b_{12} b_{13} \\ b_{21} b_{22} b_{23} \\ b_{31} b_{32} b_{33} \end{bmatrix} * \begin{bmatrix} Ins\ a \\ Ins\ b \\ Ins\ c \end{bmatrix}$$

Contribution to total negative seq. current from the HV side (Y)

Contribution to total negative seq. current from the LV side (d)

The total negative sequence differential current Idns_L1 is low (theoretically zero) in case of an external fault, and high in case of an internal fault. More important, however, than the total negative sequence differential current itself, are in this context its two (three for a three-winding power transformer) components, the one from the primary HV side, and one from the secondary LV side. These two components are compared as to their direction by the fault discriminator, in order to decide whether the fault is internal or external.

The two components of the total negative sequence differential current are phasors. Each of them has a magnitude and a phase in the complex plane. To be able to make a trustworthy directional comparison on these two phasors, each of their magnitudes must exceed a certain minimum value. Otherwise, no directional comparison is allowed. The minimum value must be above values that can be measured during normal operation of the power system. This value is up to a couple of percent of the power transformer rated current.

If both contributions to the total negative sequence differential current exceed the minimum value, which in itself can be taken as a sign that a fault must have happened, as the negative sequence currents are a superimposed, a pure-fault quantity, then a directional comparison is made. The relative phase angle between both phasors, which represent the respective contributions, is determined. Based on the value of this relative phase angle, an internal or external fault is detected and declared.

Figure 2:
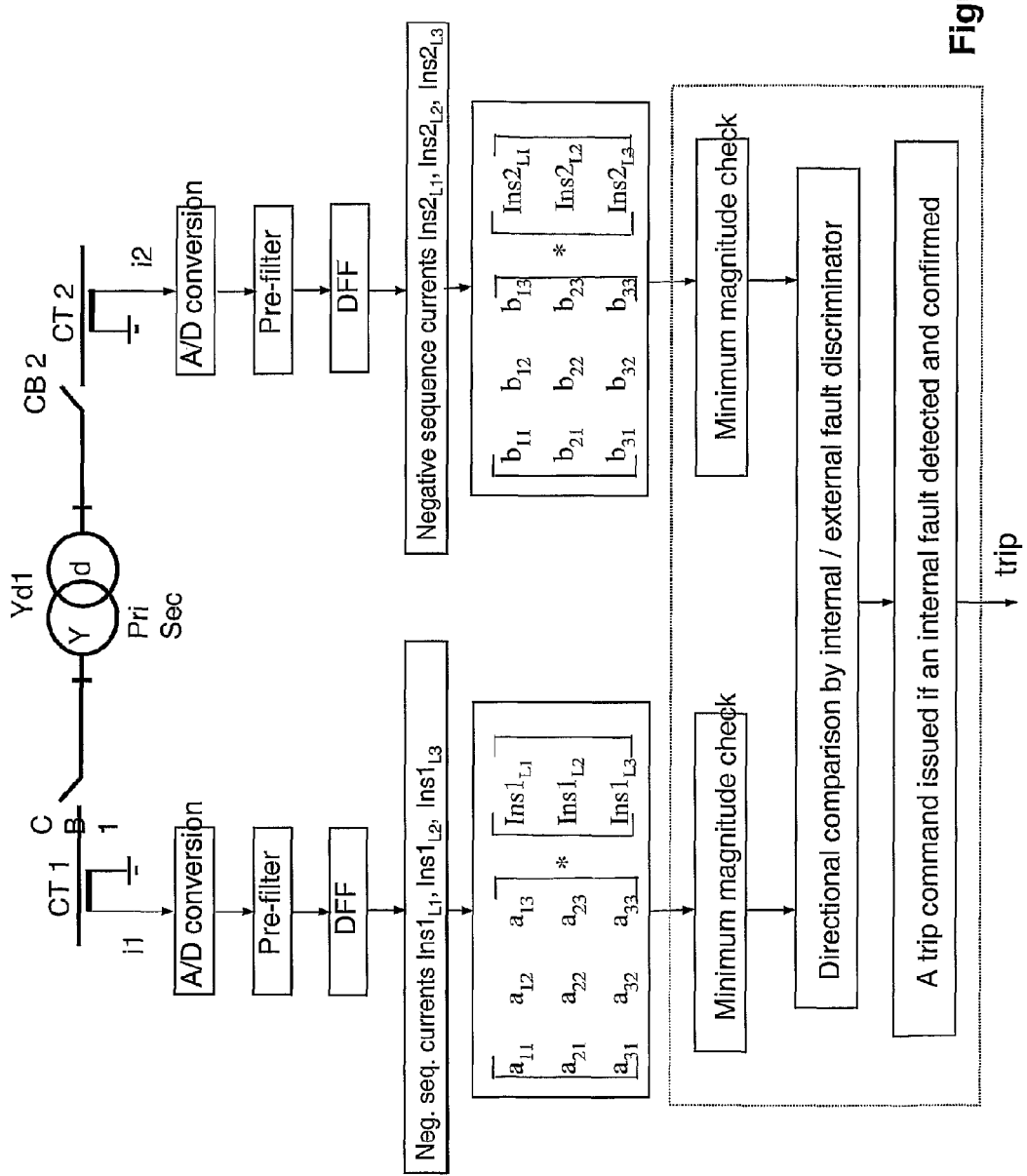
FIG. 2 illustrates a protected zone that may include power lines and shows the default connection of some current transformers.

In FIG. 2 is disclosed a protected zone that may include power lines. The figure also show the default connection of some current transformers. Analog to Digital converters are then connected to current transformers after which pre-filters having a cutoff frequency of about 500 or 600 Hz are connected. To the pre-filters are connected Fourier filters in which the currents now are as phasors. Negative sequence currents occur on both sides. In order to be able to do any relevant directional comparison, the negative sequence currents from both sides of an eventual power transformers must be referred to one (or the other) power transformer side. The power transformer phase shift must be compensated for. Negative sequence components from both side must exceed a certain minimum value, otherwise no directional comparison is made. The purpose of this condition is to exclude the negative sequence currents due to eventual power system prefault asymmetry. If the directional comparison results in an indication of an internal fault, a trip command is issued. The indication of an internal fault must prior to that be confirmed several times.

Figure 3:
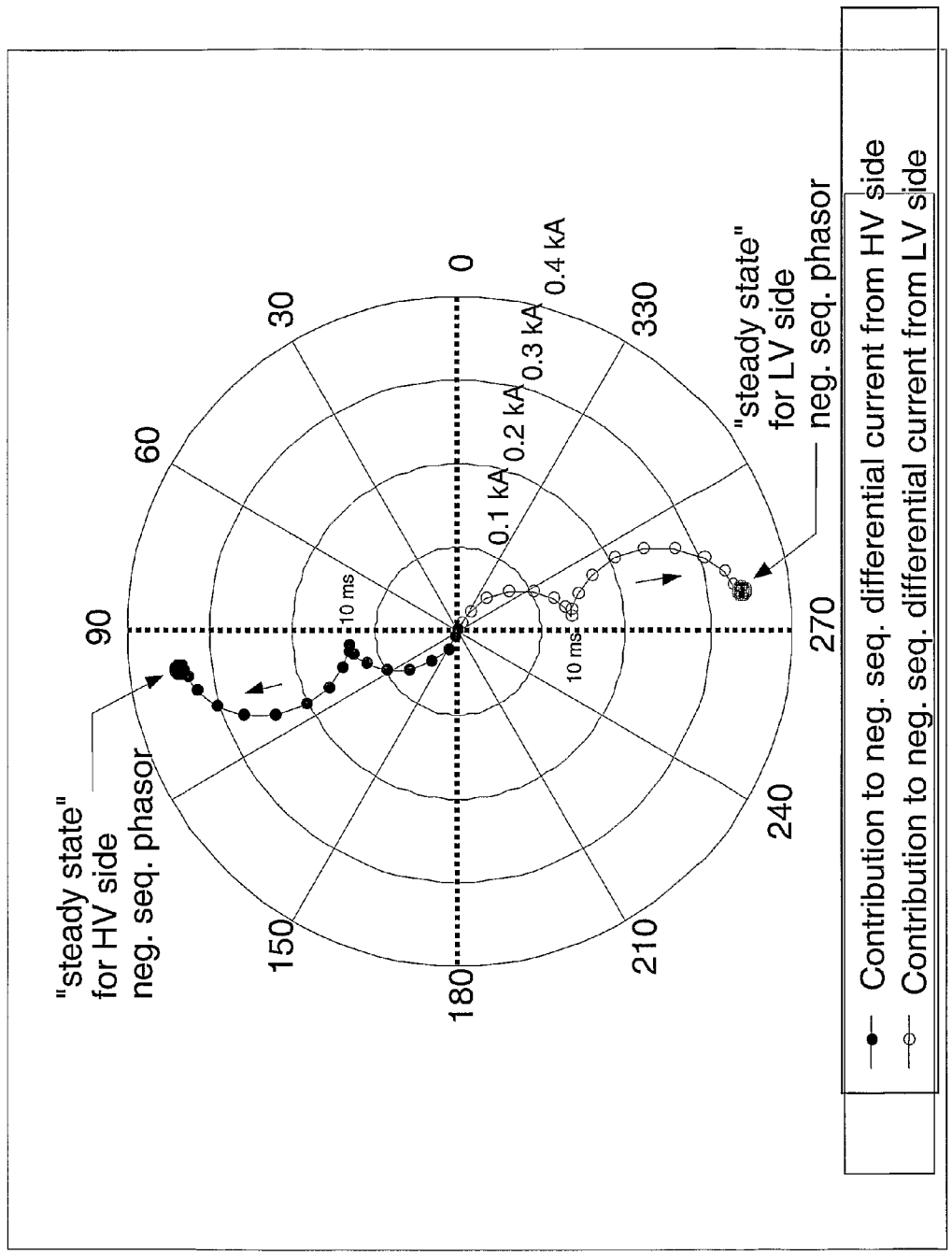
FIG. 3 illustrates trajectories of the phasors representing the contributions to the total negative sequence differential current from the power transformer primary (HV) and secondary (LV) sides, for an external earth fault on the HV side.

FIG. 3 illustrates the situation for an external single-phase earth fault on the earthed Y side of an Yd1 transformer. There is little or no current transformer saturation. At any point of time, the phase angle between the two phasors was 180 degrees. The sum of these two phasors, which is the total negative sequence differential current, was nearly zero at all times, which corresponds to the fact that the fault was external. Current transformers were connected as in FIG. 1.

Based on the phase angle between the two phasors, an internal or an external fault is declared. An internal fault is declared if the angle stays within ±60 degrees under an interval of time.

Figure 4:
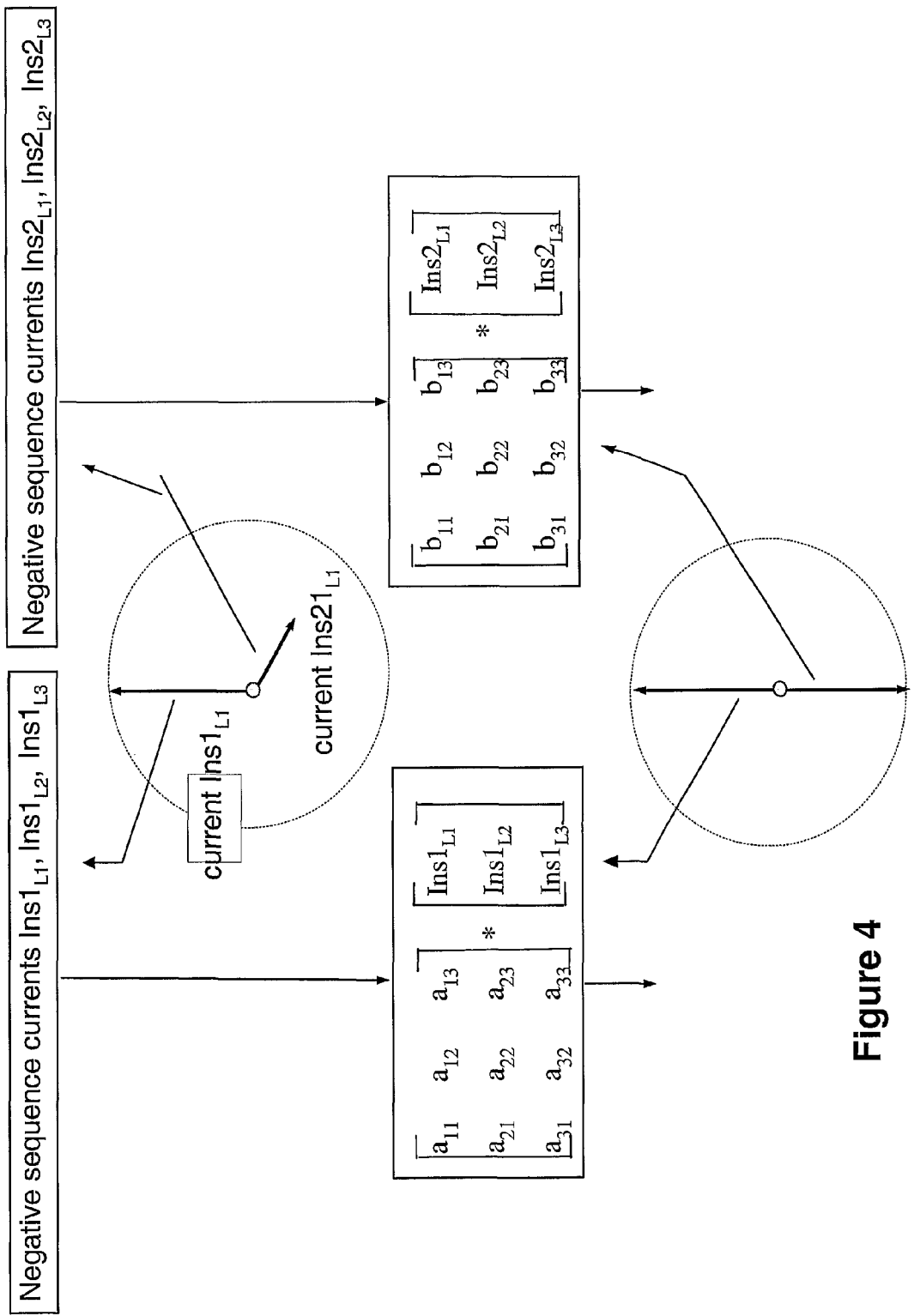
FIG. 4 illustrates in detail what is actually done by a matrix multiplication.

In FIG. 4 it is in detail explained what is actually done by the matrix multiplication. Negative sequence currents are present on both sides. The negative sequence currents on both sides of a power transformer are in a great majority of cases of different magnitudes, and of different phase positions. In order to be able to do any comparison on these currents, they must first be referred to a common base. This is done by matrix multiplications in the next phase.

In order to be able to do any relevant directional comparison, the negative sequence currents from both sides of an eventual power transformer must be referred to one (or the other) power transformer side. The power transformer phase shift must be compensated for.

The negative sequence currents from both or all power transformer sides are now referred to the same power transformer side. Their magnitudes and phase positions can now be correctly compared.

One of the most important factors to be taken into account when forming a boundary is current transformer saturation phenomenon.

Combined with some additional safety measures, such as time constraints, the internal/external fault discriminator has proved reliable. It takes normally about 10 ms after a fault to detect the fault and classify it as internal or external.

The internal/external fault discriminator only works if the protected power transformer is connected to some load, so that currents can flow on both sides of the power transformer, or at least two sides in case of a three-winding power transformer. Thus, at an initial current inrush, the algorithm declares neither internal, nor external fault. In such cases one has to rely on the usual features of the differential protection, such as, for example, the harmonic restraint, or the waveform restraint for inrush. Likewise, an internal fault on an energized, but unloaded power transformer is not detected by the fault discriminator.

As the newly introduced fault discriminator proved to be very reliable, it has been given a great power. If, for example, a fault has been detected, i.e. start signals set, and it is found to be an internal one, then any eventual block signals produced by either the harmonic or the waveform restraints, are ignored. This assures the response times of the protection below 20 ms, even for heavy internal faults with severely saturated current transformers.

External faults happen ten to hundred times more often than internal ones. Many differential protection relays have a rather poor stability against external faults. If a fault has been detected, and it is found to be an external one, any trip request is cancelled. This assures high stability against external faults. There is, however, an interesting exception, which copes with minor internal faults, such as inter-turn faults, which may occur due to, and immediately after, an external fault. The idea behind this feature is as follows.

If an external fault is being signalized without interruption, while the zero sequence currents have been eliminated from the fundamental frequency differential currents (an option), and an eventual On-Load-Tap-Changer (OLTC) movements compensated for, and then one or more start signals are set, but at the same time no harmonic restrain signals (neither the external, nor the internal fault, caused current transformers to saturate), then a minor internal fault can be suspected. This minor internal fault can be prevented from developing into a major one by immediate disconnection of the faulty power transformer, without waiting for the external fault to be cleared first.

Typically the operate-restrain characteristic of the differential protection must be set relatively high (for example because of an uncompensated OLTC), then minor internal faults cannot be detected by electrical protections before they develop into major ones, with more severe damage to the power transformer as a consequence.

A special protection, based exclusively on the internal/external fault discriminator has been introduced, which is a completely independent part of the differential protection. This protection is called the Sensitive Negative Sequence Differential Protection (SNSDP) and has no logical connection to the "usual" differential protection algorithm. No start signal has to be issued by the latter in order to activate the SNSDP.

The SNSDP is more sensitive than the "usual" differential protection algorithm. Inter-turn faults including more than about 2% of turns of a winding can be detected. An extra delay of 20 ms has been added as a precaution. Operate times of about 30 ms to 40 ms can be expected, which are better than the electromechanical Buchholtz relay's 50 ms to 150 ms.

The principle of the internal/external fault discriminator can be extended to power transformers with three windings. If all three windings are connected to their respective networks, then three directional comparisons can be done, but only two comparisons are necessary in order to positively determine the position of the fault with respect to the protected zone. The directional comparisons, which are possible, are: primary-secondary, primary-tertiary, and secondary-tertiary. The rule applied by the internal/external fault discriminator in case of three-winding power transformers is, If all comparisons indicate an internal fault, then it is an internal fault.

If any comparison indicates an external fault, then it is an external fault

If one of the windings is not connected, the algorithm automatically reduces to the two-winding version. Nevertheless, the whole power transformer is protected, inclusive the non-connected winding.

The negative-sequence-current-based directional principle yields a fast and reliable discrimination between external and internal faults. This is easy to understand in case of unsymmetrical faults, where the negative sequence system is expected to exist. But the principle is just as efficient in case of wholly symmetrical faults. The reason is that when a (symmetrical) three-phase fault occurs, the negative sequence current source appears at the fault for a while, more exactly, until the dc components in the fault currents die out. As far as power transformers are concerned, this interval of time is long enough for the directional criterion to declare either an internal or an external fault.

The negative sequence quantities are used extensively in the field of relaying protection, particularly in the protection of power lines. The existence of relatively high negative sequence currents is in itself an indication of a disturbance, as the negative sequence currents are superimposed, pure-fault quantities. The negative sequence quantities seem to be particularly suitable for different kinds of directional tests. One advantage of the negative sequence quantities, as compared to the zero sequence ones, is that they are not stopped at a power transformer of the Yd, or Dy connection. Negative sequence quantities are properly transformed to the other side of any power transformer.

The protection principle of the present invention can easily be extended and applied for the protection of multi-winding power transformers as well as for the protection of autotransformers.

A method according to the invention may also, at least partly, be performed under control of a set of computer readable instructions or code means contained in a computer program storage device for making a computer or processor perform any of the steps of the above described method.

The invention may also use a computer readable product for carrying out the method according to the invention.

While the present invention has been described in terms of the preferred embodiments, the invention is not limited thereto, but can be embodied in various ways without departing from the principle of the invention as defined in the appended claims.

The invention claimed is:

1. A method for fault detection in a power transformer/autotransformer and/or interconnected power lines that are within a zone protected by a differential protection, the method comprising:

calculating contributions of negative sequence currents of individual sides of a protected object to a total negative sequence differential current by compensating for a phase shift of the power transformer within a protected zone;

comparing relative positions of compensated negative sequence currents of individual sides of the protected object in a complex plane, in order to determine whether a source of the negative sequence currents is within the protected zone or outside of the protected zone, delimited with current transformer locations; and disconnecting the protected object if it is determined that the source of the negative sequence currents is within the protected zone.

2. The method according to claim 1, wherein the method detects turn-to-turn faults in power transformer/autotransformer windings and includes measuring all individual instantaneous phase currents of the protected object and calculating individual phase currents as fundamental frequency phasors.

3. The method according to claim 1, wherein the source of the negative sequence currents is a fault position.

4. A device for detecting a fault in a power transformer or autotransformer, that are within a zone protected by a differential protection, the device comprising:

a measuring module configured to measure all individual instantaneous phase currents of a protected object;

a first calculating module connected to the measuring module and programmed to calculate individual phase currents as fundamental frequency phasors;

a second calculating module connected to the first calculating module and programmed to calculate contributions of negative sequence currents of individual sides of the protected object to a total negative sequence differential current by compensating for a phase shift of an eventual power transformer within the protected zone;

a comparing module connected to the second calculating module and programmed to compare relative positions of compensated negative sequence currents of the individual sides of the protected object in a complex plane, in order to determine whether a source of the negative sequence currents is within the protected zone or outside of the protected zone, delimited with current transformer locations; and a disconnecting module connected to the comparing module and configured to disconnect the protected object if it is determined that the source of the negative sequence currents is within the protected zone.

5. The device according to claim 4, further comprising:
a fault discriminator arranged to determine when a fault occurs.

6. The device according to claim 4, further comprising:
a fault discriminator arranged to determine if the fault is internal or external.

7. The device according to claim 4, wherein the source of the negative sequence currents is a fault position.

8. A computer program product, comprising:
a computer readable medium;
computer program instructions recorded on the computer readable medium, executable by a processor for performing the step of:

calculating contributions of negative sequence currents of individual sides of a protected object to a total negative sequence differential current by compensating for a phase shift of the power transformer within a protected zone;

comparing relative positions of compensated negative sequence currents of individual sides of the protected object in a complex plane, in order to determine whether a source of the negative sequence currents is within the protected zone or outside of the protected zone, delimited with current transformer locations; and disconnecting the protected object if it is determined that the source of the negative sequence currents is within the protected zone.

9. The computer program product, according to claim 8, wherein the computer program instructions are further for carrying out the step of at least partially providing the computer program instructions through a network.

10. The computer program product according to claim 9, wherein the network is the internet.

* * * * *